(12) United States Patent
Kraemer et al.

(10) Patent No.: US 8,202,053 B2
(45) Date of Patent: Jun. 19, 2012

(54) MICRO-ELECTROMECHANICAL CURRENT SENSING APPARATUS

(75) Inventors: Sebastian Gerhard Maxim Kraemer, Munich (DE); Yaru Najem Mendez Hernandez, Munich (DE)

(73) Assignee: General Electric Company, Niskayuna, NY (US)

( * ) Notice: Subject to any disclaimer, the term of this patent is extended or adjusted under 35 U.S.C. 154(b) by 1127 days.

(21) Appl. No.: 12/051,290

(22) Filed: Mar. 19, 2008

(65) Prior Publication Data

US 2009/0236853 A1   Sep. 24, 2009

(51) Int. Cl.
*B63H 1/00* (2006.01)
*B63H 3/00* (2006.01)
*A47C 7/74* (2006.01)

(52) U.S. Cl. .................... 416/61; 416/146 R
(58) Field of Classification Search .......... 416/61, 416/146 R; 356/364–370
See application file for complete search history.

(56) References Cited

U.S. PATENT DOCUMENTS

| | | | |
|---|---|---|---|
| 4,539,521 A * | 9/1985 | Matsumoto | 324/244.1 |
| 4,542,338 A | 9/1985 | Arditty et al. | |
| 4,584,470 A * | 4/1986 | Iizuka et al. | 250/227.21 |
| 5,304,920 A | 4/1994 | Stierlin | |
| 5,521,603 A | 5/1996 | Young | |
| 5,977,762 A | 11/1999 | Murtha, Jr. et al. | |
| 2003/0095263 A1 * | 5/2003 | Varshneya et al. | 356/477 |
| 2006/0126252 A1 * | 6/2006 | Mortensen | 361/118 |
| 2008/0017788 A1 * | 1/2008 | Kraemer | 250/227.11 |
| 2008/0137092 A1 * | 6/2008 | Kraemer et al. | 356/477 |
| 2009/0051222 A1 * | 2/2009 | Schellings | 307/65 |

FOREIGN PATENT DOCUMENTS

| | | |
|---|---|---|
| JP | 6319572 | 7/1986 |
| JP | 11183528 | 9/1999 |

OTHER PUBLICATIONS

PA200900324, Danish Search Report, Apr. 27, 2010.
JG Bai et al., "Magneto-optical current sensing for applications in integrated power electronics modules," Science Direct Sensors and Actuators A Physical, vol. 109, No. 1-2, Dec. 1, 2003, pp. 9-16.
JP1183528 Abstract, Jul. 9, 1999.
JP63019572 Abstract, Jan. 27, 1988.

* cited by examiner

*Primary Examiner* — Edward Look
*Assistant Examiner* — Su Htay
(74) *Attorney, Agent, or Firm* — Ann M. Agosti (57) ABSTRACT

An apparatus includes an optical portion disposed on a carrier portion. The optical portion includes an optical path of and a magneto-sensitive element within the optical path. A light source is disposed on the carrier portion in operative communication with a first end of the optical path, and a photodetector is disposed on the carrier portion in operative communication with a second end of the optical path.

23 Claims, 5 Drawing Sheets

MICRO-ELECTROMECHANICAL CURRENT SENSING APPARATUS

BACKGROUND OF THE INVENTION

The present disclosure generally relates to current sensing, and more particularly, to micro-electromechanical (MEMS) current sensing apparatuses.

Generally, magnetic field sensing apparatuses for surge and/or impulse current registration are limited to semiconductor-based systems using loop antennas, Rogowski coils (or magnetic cards). The loop antennas detect a change in the magnetic field, which results in a change in voltage, registering the voltage at terminals on the antennas. However, antennas and magnetic cards have limitations in that these devices are very susceptible to electromagnetic interference (EMI). Also Rogowski coils observe limitations concerning the bandwidth for current measurements and magnetic field measurements.

Furthermore, these devices are difficult to integrate in applications involving lightning detection in aircrafts, towers or tower-like structures. For example, a wind turbine has a tower-like appearance and structure, and includes blades that extend upward at regular intervals. Also for example, an aircraft has wings (airfoils), which extend outside of the main structure (fuselage) at regular intervals. Additionally, a wind turbine may be grounded, and is susceptible to both lightning and EMI. As antennas, Rogowski coils, and magnetic cards have limitations in applications involving EMI, their usability in wind turbine applications may be decreased.

BRIEF DESCRIPTION OF THE INVENTION

A micro-electromechanical current sensing apparatus comprises a carrier portion, an optical portion disposed on the carrier portion, the optical portion including an optical path and a magneto-sensitive element within the optical path, a light source disposed on the carrier portion in operative communication with a first end of the optical path, and a photo-detector disposed on the carrier portion in operative communication with a second end of the optical path.

These and other objects, advantages and features of the invention will become better understood from the detailed description of the invention that is described in conjunction with the accompanying drawings.

BRIEF DESCRIPTION OF THE DRAWINGS

These and other features, aspects, and advantages of the present invention will become better understood as the following detailed description is read with reference to the accompanying drawings in which like reference numerals represent like elements throughout the drawings, wherein.

DETAILED DESCRIPTION OF THE INVENTION

Detailed illustrative embodiments are disclosed herein. However, specific functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments.

It will be understood that, although the terms first, second, etc. may be used herein to describe various forms or models, these forms or models should not be limited by these terms. These terms are only used to distinguish one form or model from another. For example, a first form could be termed a second form, and, similarly, a second model could be termed a first model, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting of example embodiments.

Hereinafter, example embodiments of the present disclosure will be described in detail. According to example embodiments, a current sensing device integrated, in a MEMS structure is disclosed. The current sensing principles of the MEMS device is based on a Faraday effect in an optical crystal or other optical medium (e.g., optical fiber). According to at least one exemplary embodiment, a MEMS current sensing device/apparatus may include an energy source, a light source, a magneto-sensitive material, a photo detector, a signal processing/storage unit, and/or a communication unit, although some of these components may be omitted or integrated separately according to any particular implementation. The relatively small device may be placed near a conductor to register lightning and/or AC-pulsed current events by measuring the magnetic field induced by the current in the conductor. The data may be stored for transmission after the event (or at substantially the same time as the event) to a system control unit remote to the current sensing device. The device may be equipped with additional features on the MEMS structure, for example, accelerometers, strain measurements sensors, and/or temperature measurement devices. To measure the magnetic field in several dimensions, the optical portion of the sensor may be multiplexed.

One application of current sensing devices may be lightning and/or surge current detection. Lightning current measurement systems may require a broad frequency spectrum, a wide measurement range, and may need to be electromagnetic interference (EMI) isolated or resistant. Fiber optic current sensors (FOCS) may meet these specifications. FOCS rely on magneto-optic effects in which optical properties of materials are affected by magnetic fields or the materials' own magnetization. FOCS are robust with respect to EMI, as the magnetic field caused by current may be converted into an optical signal in a device with small dimensions. Hence, the electrical signal noise is not transmitted to a data acquisition unit. Other advantages of FOCS are, apart from reduced weight, that the sensor may not be damaged by over current originating from an unexpected surge caused by a lightning strike or large current event. Depending on the applied optical materials, different configurations based on the Faraday effect may be implemented as disclosed herein.

Figure 1:
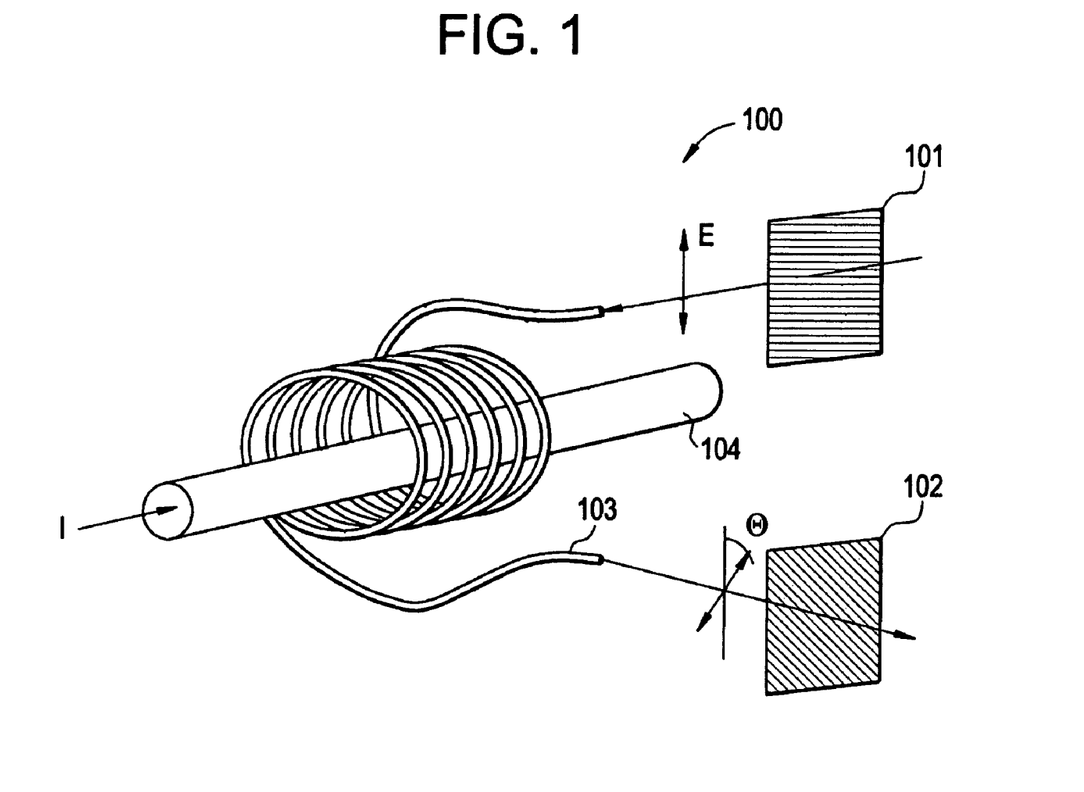
FIG. 1 illustrates an example optical current sensor apparatus, according to an example embodiment.

As depicted in FIG. 1, an exemplary optical current sensing apparatus 100 is illustrated. The apparatus 100 includes a first polarizer 101 and a second polarizer 102. The first polarizer 101 is positioned at a beginning portion of optical fiber 103, and the second polarizer 102 is positioned at an ending portion of the optical fiber 103. The optical fiber 103 is wound at least once around a conductor 104. The angle θ, through which the polarization plane of light rotates in the fiber in the presence of a magnetic field induced by the current I in the conductor 104, is given by Equation 1 presented below.

$$\theta = VNI \quad \text{Equation 1}$$

In Equation 1, V denotes the Verdet constant of the magneto-optic material (e.g., the optical fiber), N denotes the number of windings of the optical fiber 103, and I denotes the current flowing through the conductor 104. To achieve a high signal-to-noise ratio (SNR) in the output signal, several turns N of the optical fiber conductor 104 may be needed, and different optical paths and light rotation detection methods may be used to reduce and/r eliminate external effects.

Currently, fibers with a relatively large Verdet constant exist, but a long propagation path may be necessary to obtain measurable effects (e.g., large N). However, using optical fibers as a sensor may be impractical in some applications because it is not always feasible to wind the fiber coil around a conductor. Another disadvantage of an all-fiber sensor is that, in some applications, the conductor may be no smaller than 4-5 cm in diameter. Violation of this condition typically results in a relatively large temperature sensitivity. Additionally, induced linear birefringence caused by bends in the optical fiber as well as intrinsic ones due to internal stress may become increasingly significant in fiber current sensors.

However, exemplary embodiments are not limited to current sensors comprised entirely of optical fiber. According to some exemplary embodiments, optically transparent or translucent ferrimagnetic materials may be used. For example, optically transparent ferrimagnetic and ferromagnetic crystalline materials feature a large Verdet constant and hence a higher sensitivity due to an increased rotation angle per unit length. Ferrimagnetic iron garnet crystals exhibit a magneto-optic sensitivity that is orders of magnitude higher than those of typical paramagnetic and diamagnetic materials. In yttrium iron garnets (YIG), sensitivities of approx. 0.3·mT, with 500+MHz bandwidth may be obtained in flux-grown rods of 1 mm diameter and 5 mm length. Substitute garnets, such as Ga:YIG, exhibit larger sensitivities, though often with lower resonance frequencies that may decrease bandwidth.

To better understand exemplary embodiments including ferrimagnetic materials, the following description of the general Faraday effect, the Faraday effect in ferrimagnetic materials, and an exemplary current sensing apparatus comprising a ferrimagnetic block is given herein below.

The Faraday effect may generally consists of the rotation of the plane of polarization of a linearly polarized light on emergence from a medium with a longitudinally applied magnetic field. For diamagnetic and paramagnetic materials, linearly polarized light traveling in the direction of a magnetic field emerges with a net rotation θ, such that Equation 2, presented below, is satisfied.

$$\theta(\lambda,T) = V(\lambda,T) \int H dl \quad \text{Equation 2}$$

In equation 2, θ denotes the measured angle of rotation of the electric field of the emerging light, λ denotes the free-space wavelength of the emerging light, T denotes the ambient temperature, V denotes the Verdet constant of the magneto-optic material, and H denotes the magnetic field intensity along the propagation path.

Unlike optical activity, where the direction of rotation is directly related to the direction of propagation, the Faraday effect is nonreciprocal. The rotation is most directly related to magnetic field, such that reflection of light back on itself doubles the rotation, which can be a useful characteristic, particularly for FOCS using fiber coils as sensing element.

Due to the equation for diamagnetic and paramagnetic materials (Equation 2) the Verdet constant is an indicator for the suitability of a magnetic material for its use as a Faraday rotator. The optical rotation of polarized light passing through an electronic structure can be understood as circular birefringence, which is described by the existence of different indices of refraction for left-circularly l-polarized and right-circularly r-polarized light components. Each component traverses the sample with a different refractive index n and therefore with a different speed.

If light of frequency f is traversing an electronic system and/or optical path that is rotating with the Lambor frequency $f_L$, the frequency-dependant refractive indices are given by Equations 3 and 4 presented below.

$$n_l = n(f-f_L) \quad \text{Equation 3}$$

$$n_r = n(f+f_L) \quad \text{Equation 4}$$

Hence, the result for the equation of the Verdet constant is given by Equation 5 presented below.

$$V = \frac{e}{2mc}\lambda\frac{dn}{d\lambda} \quad \text{Equation 5}$$

The Verdet constant is proportional to both the wavelength of the light and to its dispersion in the medium, which is temperature dependant. In ferrimagnetic and ferromagnetic materials, the magnetization is non-linearly related to the magnetic field strength. Thus, the Verdet constant may not be used.

Ferrimagnetic materials, such as for example, yttrium and other rare earth iron garnets (e.g., YIG and RIG), have a relatively larger specific Faraday rotation if compared to optical fiber in general. This results in a smaller Faraday rotator to measure a given magnetic field strength, such that lightweight magneto-optical transducers become possible. Methods to grow these materials are well established. Furthermore, packaging of the transducer may be smaller with the introduction of high-Verdet-constant materials.

Due to the inherent magnetic properties, which have their roots at the atomic level, one possible drawback concerning ferrimagnetic and ferromagnetic materials is their complexity on a theoretical level, which do not lend them well to pure theoretical predications of the Faraday rotation, unlike diamagnetic and paramagnetic materials, where Equation 2 may be fully applied.

With regards to the Faraday effect in ferrimagnetic materials, ferrimagnetic and ferromagnetic materials become magnetized in an external magnetic field and remain magnetized after the field is removed. They may both exhibit spontaneous magnetization (i.e., they possess a net magnetic moment in the absence of a magnetic field). In ferrimagnetic materials, the magnetic moments of the atoms on different sub-lattices are opposed. However, the opposing moments are unequal, and a net magnetization remains. In ferromagnetic materials, all magnetic ions have a positive contribution to the net magnetization. Magnetism is due to the magnetic dipole moment brought about by the spin of an electron combined with its orbital angular momentum. In ferri-magnets and ferro-magnets, atoms have partially filled shells or spins which are not in up/down pairs that cancel off the dipole moment, and are thus able to have a net magnetization without an external magnetic field applied.

The electrons are in the same directions due to the Pauli exclusion principle. However, there exists a conflict phenomenon, and it is that nearby dipoles have a tendency to align in opposite directions. This creates magnetic domains, whereby there is dipole alignment at short range, but anti-alignment in the long-range. The transition between two domains is called a domain wall, or Bloch wall. Under a strong enough external magnetic field the domain will re-align. However, this also dictates that under low applied fields the existence of these domains and their interaction with an intensifying or changing magnetic field must be considered. The rapidity with which the magnetization of the material can be changed is limited by the dynamic properties of the domain wall movements.

YIG, Yttrium iron garnet, is a ferrimagnetic garnet crystal with the composition $Y_3Fe_5O_{12}$. It is transparent for light with a wavelength longer than about 1.1 µm. At 1.3 µm and 1.5 µm, wavelengths at which reliable sources and detectors are readily available in telecommunications, optical losses are relatively low.

Dispersive rotation from electrical dipole transition and a non-dispersive part rotation from magnetic dipole transition may be distinguished for YIG due to its large Faraday rotation. The contribution to the magneto-optical rotation per unit length from the different atoms can be described by Equation 6, presented below.

$$\theta(T) = (A_m + A_e)M_{Fe}^o(T) + (B_m + B_e)M_{Fe}^t(T) + (C_m + C_e)M_R(T)$$
Equation 6

The indices m and e indicate contribution from different types of resonance, and the superscripts o and t indicate octahedric and tetrahedric positions from the iron atoms of YIG. For low frequencies, the magnetic near field induced by an electrical current in a current sensing apparatus based on ferrimagnetic materials may be calculated by the Biot-Savart law represented by Equation 7, below:

$$d\vec{H} = \frac{I d\vec{l} \times \vec{r}}{4\pi r^3}$$
Equation 7

Figure 2:
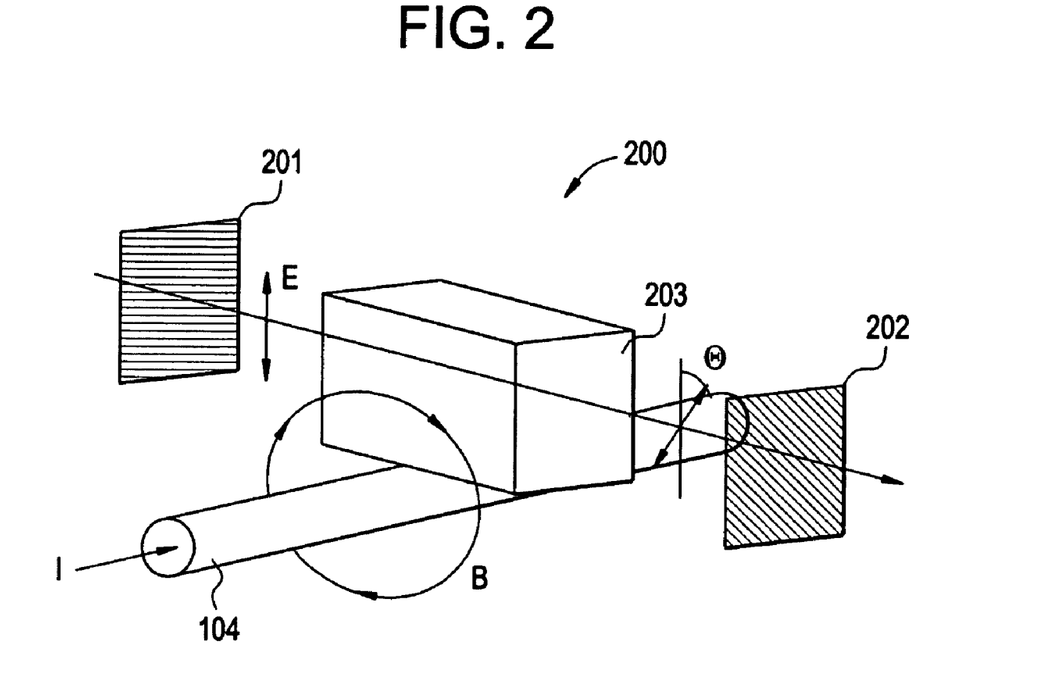
FIG. 2 illustrates an example optical current sensor apparatus, according to an example embodiment.

In Equation 7, vector H denotes the magnetic field, I represents the current in a given wire segment, vector l represents the length element of the wire segment, and vector r represents the displacement vector from the magneto-sensitive element to the field point. Therefore, ferrimagnetic materials may be used to detect the Faraday effect, and thus, may be used in optical current sensing apparatuses. For example, FIG. 2 illustrates an example optical current sensor apparatus 200 including ferrimagnetic material, according to an example embodiment.

The apparatus 200 includes polarizers 201 and 202. The polarizers 201 and 202 may be similar to polarizers 101 and 102. For example, polarizers 201 and 202 may be used to effectively polarize light entering the apparatus 200, and to measure an angle θ, representing the change in angle of polarization of light exiting the apparatus 200. The apparatus 200 further includes ferrimagnetic block 203. The ferrimagnetic block 203 may comprise any ferrimagnetic material, for example, as described above. Furthermore, the ferrimagnetic block 203 may be of a generally rectangular shape. Alternatively, the ferrimagnetic block 203 may be in a generally elliptical shape, allowing for light entering the block 203 to travel a distance l, representing the overall length of the block 203. As the light travels the distance l, it experiences a change in angle of polarization related to a magnetic field affecting the ferrimagnetic block 203. For example, the effects of the magnetic field are described in detail above.

The apparatus 200 further includes a conductor 104. The conductor 104 may be similar to the conductor 104 of FIG. 1, and may therefore carry a current I to be measured by the apparatus 200. The current I produces the magnetic field B which affects the ferrimagnetic block 203, thereby altering the angle of polarization of light within the ferrimagnetic block 203, allowing the apparatus 200 to effectively measure the current I.

To measure current (e.g., lightning current), the sensing element of the fiber optic magnetic field sensor (i.e., block 203) may be placed relatively close to the conductor 104 to detect the magnetic field density B or magnetic field H produced or induced by the current and to minimize effects resulting from sources of interference. In the sensor head, the magneto-optic iron garnet, or block 203, may be arranged between the two polarizers 201 and 202 (see FIG. 2). As light source, a super-luminescent diode (SLD), a laser diode, or a light emitting diode may be used, which couples light into an optical waveguide (e.g., optical fiber) feeding the block 203. Additional optical devices, such as for example, lenses or other devices may be used to aid in coupling light exiting the optical waveguide to the ferrimagnetic block 203. Similar optical devices (e.g., lenses, etc) may be used to couple light exiting the ferrimagnetic block 203 to another optical waveguide to be transmitted to a light sensor, such as a semiconductor photo receiver, reverse biased diode, or other suitable device such as an opto-electrical converter. Thus, the output of the sensor head may be an intensity-modulated light signal which is transported to the opto-electrical (o/e) converter via another optical waveguide.

Hereinafter, a MEMS current sensing apparatus will be described with reference to FIGS. 3 and 4. The MEMS current sensing apparatus may operate based on the principles described above, and may include ferrimagnetic and/or ferromagnetic materials and/or other magneto-sensitive materials for detecting the Faraday effect, and therefore, may be used in current sensing applications.

Figure 3:
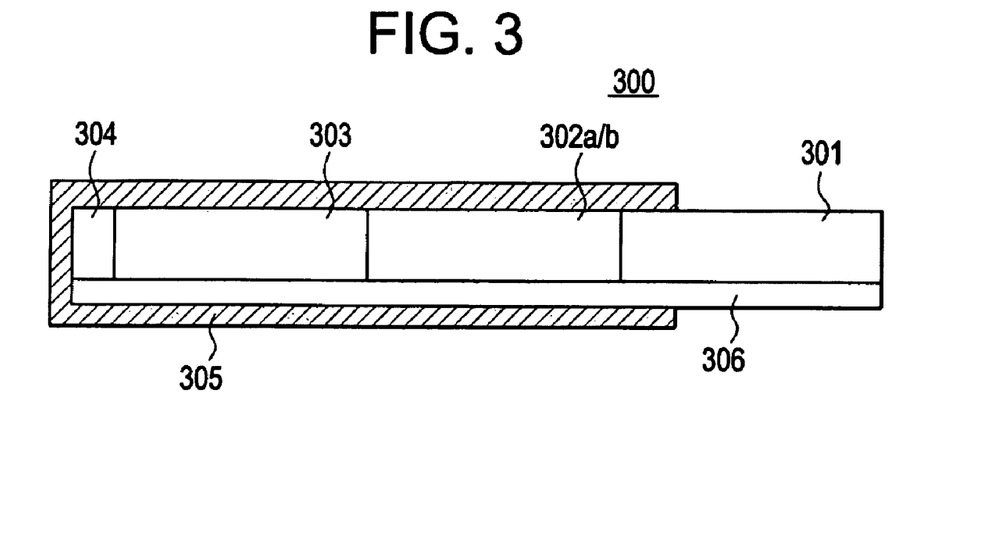
FIG. 3 illustrates a cross section of a MEMS current sensing apparatus, according to an example embodiment.

Turning to FIG. 3, a cross section of a MEMS current sensing apparatus 300 is illustrated, according to an example embodiment. The apparatus 300 includes an optical portion 301. The optical portion 301 may include optical waveguides and magneto-sensitive elements, for example, optical fiber and/or ferrimagnetic materials. The apparatus 300 further includes light source/photo-detector portion 302 a/b. The portion 302 a/b may include a separate light source for transmitting polarized light through the optical portion 301, and a separate photo-detector for detecting the Faraday effect from polarized light exiting the optical portion 301.

The apparatus 300 further includes a signal processing/energy source portion 303. The portion 303 may provide energy for the light source of portion 302 and other portions of the apparatus 300. Further, the portion 303 may provide signal-processing operations such as, for example, operations somewhat similar to the equations described in detail hereinbefore. The operations may include determining a current value or detecting a lightning strike based on an angular difference of polarized light exiting the optical portion 301.

The apparatus 300 further includes a communication unit 304. The communication unit 304 may be in operative communication with the portion 303, and may transmit information related to current detected by the apparatus 300. For example, a current may flow in relatively close proximity to the apparatus 300. The current may be detected through an angular change in the polarization of light exiting the optical portion 301, which may be detected by a change in the light intensity. The portion 303 may interpret the angular difference and determine if a current or magnetic field varying event has occurred (e.g., a lightning strike). Thereafter, or at substantially the same time, the communications portion 304 may transmit information relating to the determination.

The apparatus 300 further includes an EMI isolation or reduction barrier 305. The barrier 305 may provide some shielding from or reduction of EMI for the apparatus 300. For example, although the optical portion 301 may be relatively unaffected by EMI, the portions 303 and/or 304 may require an amount of EMI reduction/isolation. The barrier 305 may be comprised of any suitable material for reducing EMI.

The apparatus 300 further includes carrier 306. Carrier 306 may be a mechanical portion or substrate effectively supporting the different portions of the apparatus 300 (e.g., 301-305). Turning to FIG. 4, an overhead view of the MEMS current sensing apparatus 300 is illustrated, according to an example embodiment.

Figure 4:
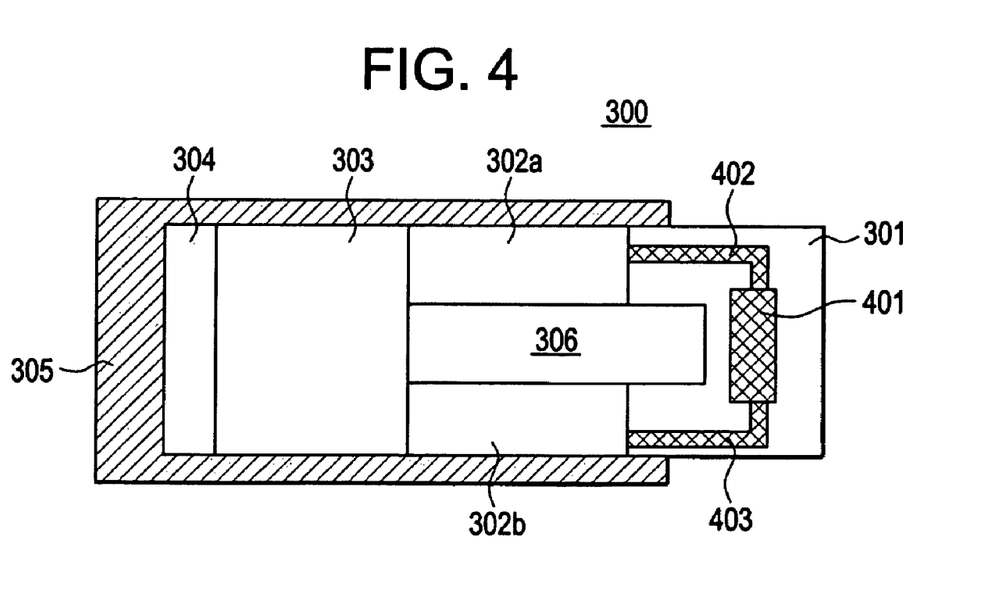
FIG. 4 illustrates an overhead view of a MEMS current sensing apparatus, according to an example embodiment.

As illustrated in FIG. 4, the apparatus 300 may further include optical waveguides 402 and 403 situated within or upon the optical portion 301. The optical waveguides may provide a path for light to travel to/from light source/photo-detector portions 302 a/b. The apparatus 300 further includes magneto-sensitive element 401. The magneto-sensitive element 401 may comprise ferrimagnetic, ferromagnetic, or other suitable materials, and may establish a change in angle of polarization of light traveling through the magneto-sensitive element 401 if a magnetic field is affecting the magneto-sensitive element 401. For example, a current flowing in a conductor in relatively close proximity to the apparatus 300 may produce a magnetic field which affects the magneto-sensitive element 401, thereby registering a change in polarization of light within the optical portion 301.

Therefore, as described above, example embodiments provide MEMS based current sensing apparatuses. It is noted that current sensing apparatuses as described herein may be used in a variety of applications susceptible to EMI or other forms of electrical interference. For example, as described hereinbefore, wind turbine or aircrafts may experience a relatively large amount of EMI. Furthermore, it may be desirable to detect lightning strikes (e.g., detect large current spikes) in wind turbines or aircrafts. Therefore, an example application including a wind turbine and an aircraft are described herein. This example application is for the purpose of further understanding of example embodiments only, and thus is in no way limiting of example embodiments.

Figure 5:
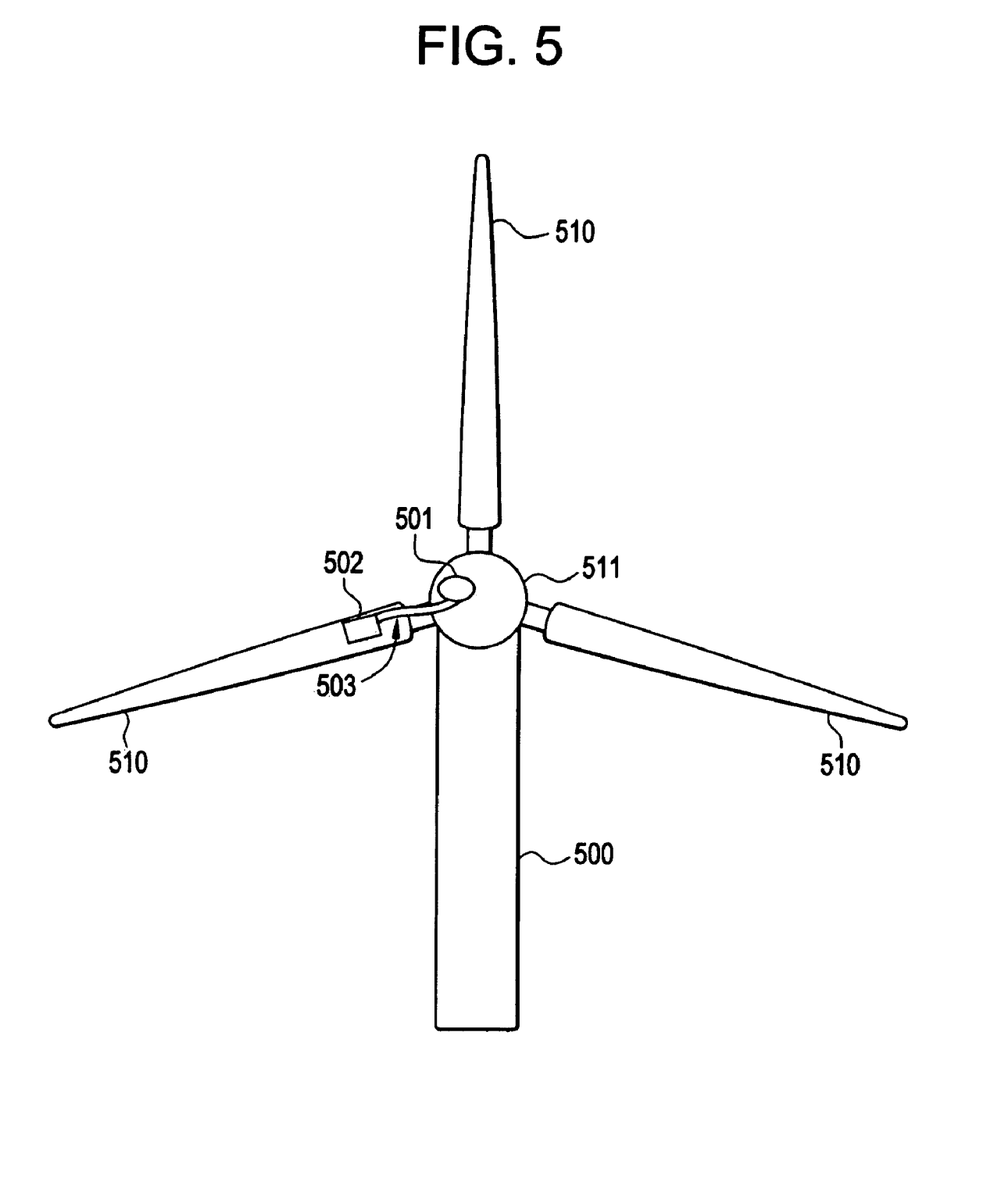
FIG. 5 illustrates an example wind turbine: application of a MEMS current sensing apparatus, according to an example embodiment.

FIG. 5 illustrates an example wind turbine application of a MEMS current sensing apparatus, according to an example embodiment. As illustrated, a wind turbine 500 may include a plurality of blades 510. Each blade may be susceptible to lightning or other current events, and therefore, one or more of the wind turbine blades 510 may be equipped with a MEMS current sensing apparatus 502. The apparatus 502 may be substantially similar to apparatus 300 described hereinbefore.

A communications channel 503 may be interconnected between the apparatus 502 and a wind turbine control unit 501. The communications channel 503 may be any communications channel effectively enabling communication of information between the apparatus 502 and the control unit 501. For example, the communications channel 503 may be a fiber optic channel, an electrical communications channel, or other suitable channel. The control unit 501 may be integrated or installed on or within the nose cone portion 511 of the wind turbine 500, and may both communicate with the apparatus 502, and control operation of the wind turbine 500.

Figure 6:
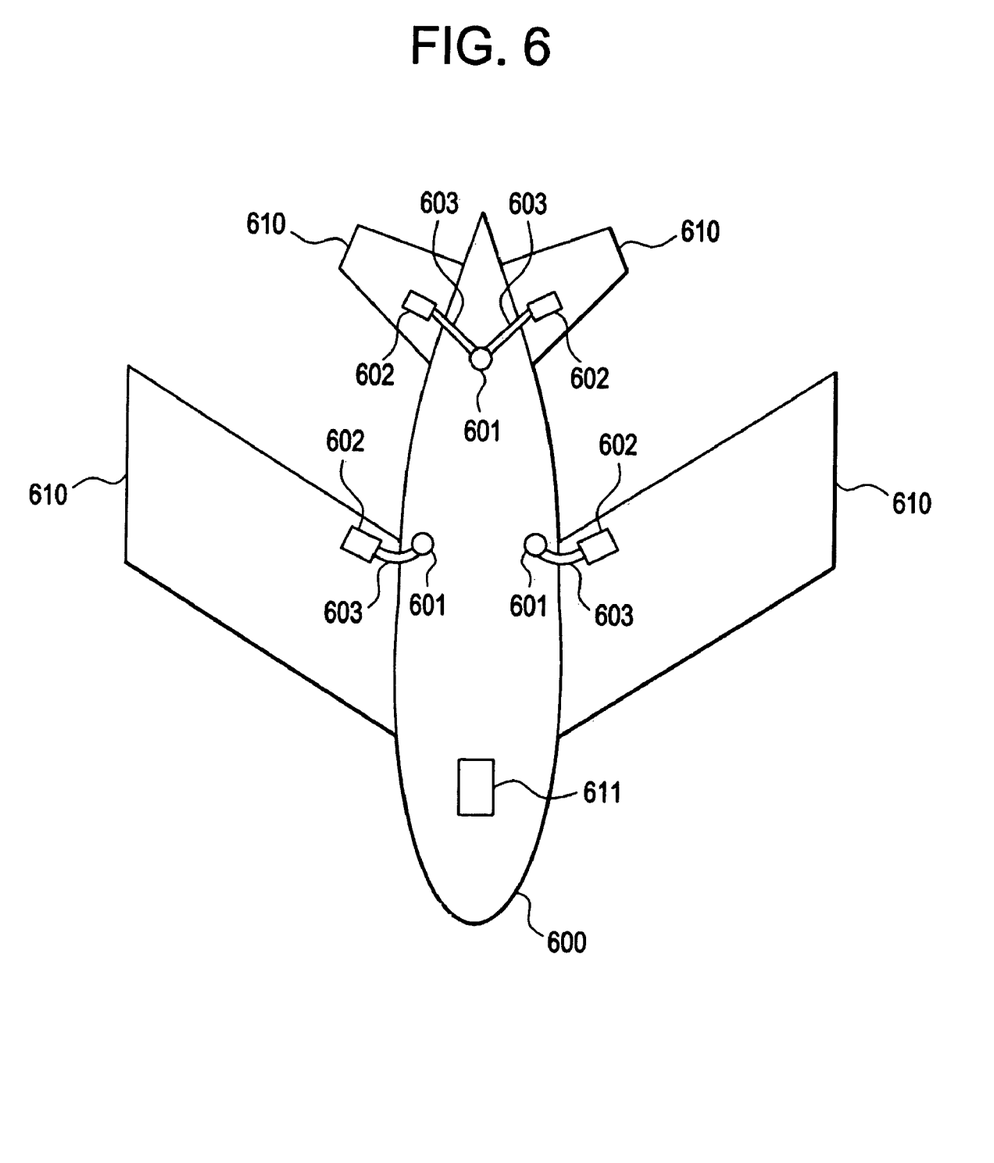
FIG. 6 is illustrates an example aircraft application of a MEMS current sensing apparatus, according to and example embodiment.

FIG. 6 illustrates an example aircraft application of a MEMS current sensing apparatus, according to an example embodiment. As illustrated, an aircraft 600 may include a plurality of wings (Airfoils) 610. Each wing may be susceptible to lightning or other current events, and therefore, one or more of the aircraft's wings 610 may be equipped with a MEMS current sensing apparatus 602. The apparatus 602 may be substantially similar to apparatus 300 described hereinbefore.

A communications channel 603 may be interconnected between the apparatus 602 and an aircraft control unit 601. The communications channel 603 may be any communications channel effectively enabling communication of information between the apparatus 602 and the control unit 601. For example, the communications channel 603 may be a fiber optic channel, an electrical communications channel, or other suitable channel. The control unit 601 may be integrated or installed on or within the fuselage portion 611 of the aircraft 600, and may both communicate with the apparatus 602, and control operation of the aircraft 600.

It is further noted that according to example embodiments, for an amount of time when the lightning detection system is, in standby modus and prepared to be triggered in case of a strike, the current through the light source is adjusted such that the o/e-converter outputs a constant signal at a defined set point. When a strike occurs, the output signal is modulated depending on the polarity of the strike current in a positive or a negative direction. However, due to a change in the ambient temperature and due to other effects in the optical equipment, this set-point signal is not constant. This drift affects the triggering of the system at the set-point and can exceed the trigger level or move towards the limits of the o/e-converter.

For a multi-sensor system (e.g., a plurality of sensors affixed to a plurality of wind-turbine blades or aircraft foils), the drift at each sensor head is the same when one common optical source is used. Hence, by observing one channel, the other sensor drifts can be deducted. To control the drift and to keep the set-points adjusted at an optimum level, an additional low frequent signal input is incorporated to the data acquisition system. This channel is connected to a control circuit which adjusts the set-points with a proportional-integral-derivative (PID) controller. As the sampling rate of the control circuit is smaller than the data acquisition for the lightning current measurement, the controller system does not interfere with the lightning current measurement.

As described herein, example embodiments provide current sensing apparatuses using optical materials. The apparatuses may be integrated with a power supply. The power supply may deliver the power for a light source, a photo detector, a data processing unit, and/or a communication unit. The power supply may be a battery, a photocell (e.g. fed by fiber optics or sunlight), and/or an electromechanical transformer. The light source may be, a super luminescent diode (SLD), a Laser diode, or a light-emitting diode. The emitted light may be linear polarized. The light may be guided on to a MEMS structure of the apparatuses in an integrated light guide system to a magneto-sensitive element or crystal. If the state of polarization cannot be controlled by the light source a polarizer may be integrated in front of the crystal. The optical crystal structure, featuring a relatively high Verdet constant (e.g. ferri- or ferromagnetic crystals), may either be deposited directly during the MEMS processing or placed afterward in the structure. After the crystal a second polarizer (e.g., 45° to the incoming light) lead to an intensity modulation of the passing light in relation to the magnetic field (Faraday effect). The photo detector unit may measure this intensity. The signal-processing unit may measure the derivative in respect to time. Lightning or current is detected as this derivative exceeds a given limit (positive or negative).

In an example of a lightning strike, the information may be stored and may be sent by a communication unit via fiber optic link, radio transmission, electrical transmission, etc, to a control unit. Electronic portions of the apparatuses may be EMI isolated. In current measurement applications, enhanced MEMS devices, measuring for example lightning parameters, may be equipped with a light source control loop. This loop, controlled with a lower frequency than the lightning frequency, may keep the output intensity at a relatively steady value. To calibrate the magnetic field measurements a temperature-sensing device may be realized in the EMI isolated MEMS structure.

With only some example embodiments of the present invention having thus been described, it will be obvious that the same may be varied in many ways. The description of the invention hereinbefore uses these examples, including the best mode, to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Such variations are not to be regarded as a departure from the spirit and scope of the present invention, and all such modifications are intended to be included within the scope of the present invention as stated in the following claims.

What is claimed is:

1. A micro-electromechanical (MEMS) current sensing apparatus, comprising:
   a carrier portion;
   an optical portion disposed on the carrier portion, the optical portion including an optical path of the MEMS current sensing apparatus and a magneto-sensitive element within the optical path;
   a light source disposed on the carrier portion in operative communication with a first end of the optical path; and
   a photo-detector disposed on the carrier portion in operative communication with a second end of the optical path.

2. The apparatus of claim 1, wherein the optical path includes an optical waveguide.

3. The apparatus of claim 2, wherein the optical waveguide is an optical fiber.

4. The apparatus of claim 2, wherein the optical waveguide includes an optical fiber coupled to the magneto-sensitive element.

5. The apparatus of claim 1, wherein the magneto-sensitive element is a ferrimagnetic block or a ferromagnetic block.

6. The apparatus of claim 1, wherein the magneto-sensitive element is a magneto-sensitive crystal.

7. The apparatus of claim 1, wherein the magneto-sensitive element is a polarization-maintaining optical fiber.

8. The apparatus of claim 1, wherein the light source is a super-luminescent diode, a light-emitting diode, or a laser diode.

9. The apparatus of claim 1, wherein light emitted by the light source is coherent light.

10. The apparatus of claim 1, wherein light emitted by the light source is linearly polarized light.

11. The apparatus of claim 1, further comprising: a signal processing portion in operative communication with the photo-detector.

12. The apparatus of claim 11, wherein the signal processing portion is in operative communication with the light source.

13. The apparatus of claim 12, wherein the signal processing portion is configured to determine an amount of current flowing in relatively close proximity to the magneto-sensitive element.

14. The apparatus of claim 11, wherein the signal processing portion is configured to determine an amount of current flowing in relatively close proximity to the magneto-sensitive element.

15. The apparatus of claim 11, further comprising: a communication portion in operative communication with the signal processing portion.

16. The apparatus of claim 15, wherein the communication portion is configured to transmit current measurement results determined by the signal processing portion.

17. The apparatus of claim 15, further comprising: an electro-magnetic isolation (EMI) barrier configured to isolate the communications portion, the signal processing portion, the light source, and the photo-detector from EMI.

18. The apparatus of claim 15, further comprising: a power source in operative communication with the photo-detector, the light source, the communications portion, and the signal processing portion.

19. The apparatus of claim 1, further comprising: a power source in operative communication with the photo-detector and the light source.

20. The apparatus of claim 19, wherein the power source is a battery, a photocell, or an electromechanical transformer.

21. A wind-turbine, comprising:
   a plurality of blades;
   a wind-turbine control unit; and
   a micro-electro mechanical (MEMS) current sensing apparatus of claim 1 affixed to at least one blade of the plurality of blades, in operative communication with the wind-turbine control unit over a communication channel comprising:
   a carrier portion;
   an optical portion disposed on the carrier portion, the optical portion including an optical path of the MEMS current sensing apparatus and a magneto-sensitive element within the optical path;

a light source disposed on the carrier portion in operative communication with a first end of the optical path; and a photo-detector disposed on the carrier portion in operative communication with a second end of the optical path.

22. The wind-turbine of claim 21, further comprising: a plurality of MEMS current sensing apparatuses, wherein each of the plurality of MEMS current sensing apparatuses is affixed to one of the plurality of blades.

23. The wind-turbine of claim 21, wherein the communications channel is a fiber-optic channel or an electrical communication channel.

* * * * *

UNITED STATES PATENT AND TRADEMARK OFFICE
CERTIFICATE OF CORRECTION

| | | |
|---|---|---|
| PATENT NO. | : 8,202,053 B2 | Page 1 of 1 |
| APPLICATION NO. | : 12/051290 | |
| DATED | : June 19, 2012 | |
| INVENTOR(S) | : Kraemer et al. | |

It is certified that error appears in the above-identified patent and that said Letters Patent is hereby corrected as shown below:

In the Claims

In Column 10, Line 58, in Claim 21, delete "of claim 1".

Signed and Sealed this
Twenty-second Day of April, 2014

Michelle K. Lee
*Deputy Director of the United States Patent and Trademark Office*